(12) United States Patent
Brokaw

(10) Patent No.: US 7,279,968 B2
(45) Date of Patent: Oct. 9, 2007

(54) AMPLIFIER OUTPUT VOLTAGE SWING EXTENDER CIRCUIT AND METHOD

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 119 days.

(21) Appl. No.: 11/337,041

(22) Filed: Jan. 19, 2006

(65) Prior Publication Data

US 2006/0164165 A1 Jul. 27, 2006

Related U.S. Application Data

(60) Provisional application No. 60/647,299, filed on Jan. 25, 2005.

(51) Int. Cl.
*H03F 3/45* (2006.01)
(52) U.S. Cl. .................................. 330/69; 330/144
(58) Field of Classification Search ............... 330/69, 330/144
See application file for complete search history.

(56) References Cited

U.S. PATENT DOCUMENTS 6,624,693 B2 * 9/2003 Yamashita .................. 330/69
7,224,226 B2 * 5/2007 Kojima et al. ............. 330/253

* cited by examiner

*Primary Examiner*—Steven J. Mottola
(74) *Attorney, Agent, or Firm*—Koppel, Patrick, Heybl & Dawson

(57) ABSTRACT

An amplifier output voltage swing extender circuit comprises a differential amplifier powered between first and second power supply rails, which receives first and second input signals at non-inverting and inverting inputs, respectively, and provides an output at a first output node. A level shifting circuit, preferably a voltage divider, is connected in series with the first output node and shifts the node voltage toward the second rail by a fixed amount; the shifted voltage is provided at a second output node. A feedback network couples the second output node voltage to the amplifier's inverting input, such that when a voltage VSET is applied to the non-inverting input, the maximum negative voltage excursion at the first and second output nodes is greater than the value of the VSET voltage with respect to the second supply rail.

15 Claims, 3 Drawing Sheets

AMPLIFIER OUTPUT VOLTAGE SWING EXTENDER CIRCUIT AND METHOD

RELATED APPLICATIONS

This application claims the benefit of provisional patent application No. 60/647,299 to Brokaw, filed Jan. 25, 2005.

BACKGROUND OF THE INVENTION

1. Field of the Invention

This invention relates to the field of amplifiers, and particularly to amplifier circuits capable of providing large output swings on demand.

2. Description of the Related Art

In some applications, an amplifier must maintain an average output, and drive more-or-less symmetrically about the average value. Such amplifiers are limited in their drive capability by the asymmetry of the supply voltages, or, in the case of a single supply amp, by the common mode voltage.

One such application is that of an LCD panel in which the amplifier provides the panel's "VCOM" voltage. A desired VCOM voltage (VSET) is applied to the amp's non-inverting output; feedback from the panel applied to the inverting input causes the amplifier to sweep out the charge resulting from pixel voltage reversal. One factor which limits the amplifier's performance in this application is the settled value of the force voltage required by the panel. If the amplifier which drives VCOM is powered by a single supply, the maximum negative output voltage swing is limited to the nominal value of the VCOM voltage with respect to ground. The limited swing extends the time it takes the VCOM amp to restore panel charge through the effective series impedance at the force terminal. The problem is more evident for negative swings; since the VCOM voltage is generally less than half the amplifier supply voltage, the available positive voltage swing is greater.

FIG. 1 illustrates the issue with a block diagram. A greatly simplified LCD panel 10 is represented by the block labeled LOAD. In practice, a number of DC voltages are applied to the panel, but for purposes of this illustration they can be lumped together at the ground terminal. A bias voltage, Vout, is applied to the panel's VCOM input by amplifier 12, which is typically capable of swinging its output voltage from rail to rail. In operation, signals are applied to various panel inputs to charge pixel and other capacitances. The net effect (as seen from the amplifier) of these signals is represented by VDRIVE, a time varying drive voltage. This source is shown isolated from panel 10 by a capacitance C. Although the panel is basically capacitive, so there is little or no net current in the various connections, changes in the pixel voltages from row to row as an image is scanned in result in charge being delivered to the panel from VDRIVE. Typically, this charge alternates, row to row, and averages to zero over several lines.

However, the amount of charge delivered to one row may be substantial and an image charge must be supplied by the VCOM amplifier in order for the pixel capacitance to be charged to the correct voltage. Since the effective time constant of the distributed R-C of the panel may be longer than the time allotted to write a row of pixels, simply maintaining the voltage applied to VCOM may not suffice to charge all the pixels to their desired final voltage.

One remedy for this problem is to sense the disturbance of the LCD panel network (via the panel's SENSE node) and use feedback to drive the VCOM voltage so as to rapidly sweep out the image charge from the pixel voltage changes. For example, assume that for a given row, the effect of all the pixel voltage changes is as if VDRIVE went positive. This would drive the VCOM return path through the pixel capacitances and the distributed resistance, tending to drive the SENSE node positive. The SENSE node is coupled to the inverting input of amp 12 via a resistance R1, which is also driven positive. This causes Vout to swing negative, in opposition to the drive from VDRIVE, and rapidly provide the majority of the image charge required to set the pixel voltages. Vout is also fed back to the inverting input via a resistance R2; this feedback causes the amplifier to recover to the desired VCOM voltage after the large output voltage pulse.

The signs of the pixel voltages are typically arranged so that they will alternate from row to row, so that the next row will require VDRIVE to go negative, restoring most of the charge from the previous line, and requiring VCOM to be driven positive.

Some picture content may call for very large amounts of charge per row, and therefore large peak currents. Since the input of the panel is more-or-less resistive, a large signal swing may be required to replace the charge for these rows. For this reason, a rail-to-rail amplifier is usually preferred in order to get the greatest possible voltage swing. For reasons of system architecture, a grounded single supply amplifier is generally preferred. Here, the maximum output voltage swing the amplifier can supply is limited to the difference between the nominal settled VCOM voltage and the supply rail to which the output swings. The amplifier's positive supply—and thus the positive output swing—can be made arbitrarily large. However, the negative voltage swing is limited to ground potential. The desired VCOM voltage is constrained by the biasing needs of the panel to a relatively small voltage. For example, if VSET is set to 4V and the positive supply voltage is 12V, amplifier 12 can drive panel 10 with a positive pulse approaching 8V in amplitude, while the negative pulse is limited to 4V.

For some difficult display content, the charge required may be greater than the ~4V signal that amplifier 12 can provide in the time allotted, resulting in the pixels being left with the wrong voltage stored on them. This creates a problem which is particularly noticeable when the picture has areas of uniform color which overload the VCOM amp, and other areas of less troublesome picture content which do not overload the amplifier. The "good" picture content reduces the charge requirements in the rows where it appears, so that the background is rendered properly in those rows, while in rows consisting entirely of the troublesome pixels, pixel voltages do not settle completely to the correct values, and these rows appear different from the rows with additional content. This undesirable phenomenon is known as "banding" and is quite noticeable.

SUMMARY OF THE INVENTION

An amplifier output voltage swing extender circuit and method are presented which overcome the problems noted above, by centering the bias point of a power amplifier to improve its peak-to-peak symmetric range despite an offset in the load bias point.

The present voltage swing extender circuit comprises a differential amplifier which is powered between first and second power supply rails, receives first and second input signals at its non-inverting and inverting inputs, respectively, and provides an output signal at a first output node. A level shifting circuit, preferably a voltage divider, is connected in series with the first output node and shifts the node voltage toward the second rail by a fixed amount; the shifted voltage is provided at a second output node. A feedback network couples the voltage at the second output node to the amplifier's inverting input as a feedback signal, such that, when a voltage VSET is applied to the non-inverting input, the maximum negative voltage excursion at the first and second output nodes is greater than the value of the VSET voltage with respect to the second supply rail. In the case of a single supply VCOM amplifier, for example, the present invention permits the amplifier to drive an LCD panel's VCOM terminal negative with respect to circuit ground.

The level shifting circuit preferably comprises a voltage divider made from a first resistance R1 connected in series between the first output node and the second output node and a second resistance R2 connected between the second output node and the second power rail, and a capacitance C1 which is connected across R1. In a typical LCD panel application, pixel rows are periodically refreshed; C1 is sized such that R1*C1 is greater than the row driving period, so that the full voltage excursion at the first output node is conveyed to the second output node, and thus to the load.

When VSET is a known voltage, the level shifting circuit is preferably arranged such that the first output node is equal to $[(V+)-(V-)]/2$ when VSET is at the known voltage and the amplifier circuit is in an equilibrium state, where V+ and V− are the first and second power supply rail voltages, respectively, such that the amplifier circuit's bias point is centered.

Further features and advantages of the invention will be apparent to those skilled in the art from the following detailed description, taken together with the accompanying drawings.

DETAILED DESCRIPTION OF THE INVENTION

The present amplifier output voltage swing extender circuit can be arranged to center the bias point of a power amplifier, to improve its peak-to-peak symmetric range despite an offset in the load bias point. The circuit is especially useful in single-supply applications: when properly arranged, the maximum negative voltage excursion of the circuit's output is increased, with a final output node capable of being driven negative with respect to circuit ground.

The capabilities afforded by the present circuit are especially advantageous when used to provide the VCOM voltage for an LCD panel. As noted above, for some display content, the charge required to charge the pixel capacitances may be greater than the VCOM amplifier can provide in the time allotted, resulting in pixels being left with the wrong voltage stored on them. Recalling the example above: assuming that the VCOM amplifier is powered by a single supply and operates rail-to-rail, with VSET set to 4V and positive supply voltage V+ set to 12V, the amplifier can drive an LCD panel with a positive pulse approaching 8V in amplitude, while the negative pulse is limited to 4V. Increasing V+ can increase the maximum excursion of a positive pulse, but has no effect on the maximum negative excursion.

Figure 2:
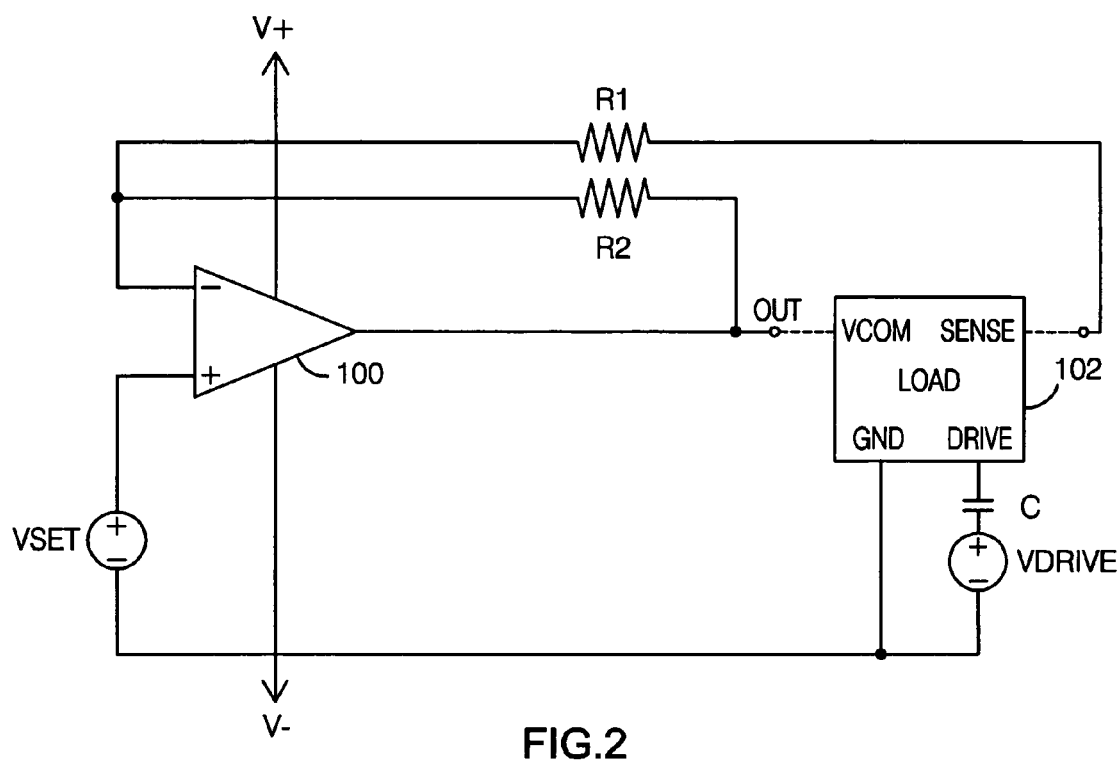
FIG. 2 is a block diagram of another known amplifier circuit.

One known solution to this limitation is shown in FIG. 2. Here, amplifier 100 is powered between V+ and a negative supply voltage V−. Now, with VSET set to 4V, V+ set to 12V, and V− set to −12V, the amplifier can drive an LCD panel with a positive pulse approaching 8V in amplitude, and a negative pulse approaching 16V.

Figure 3:
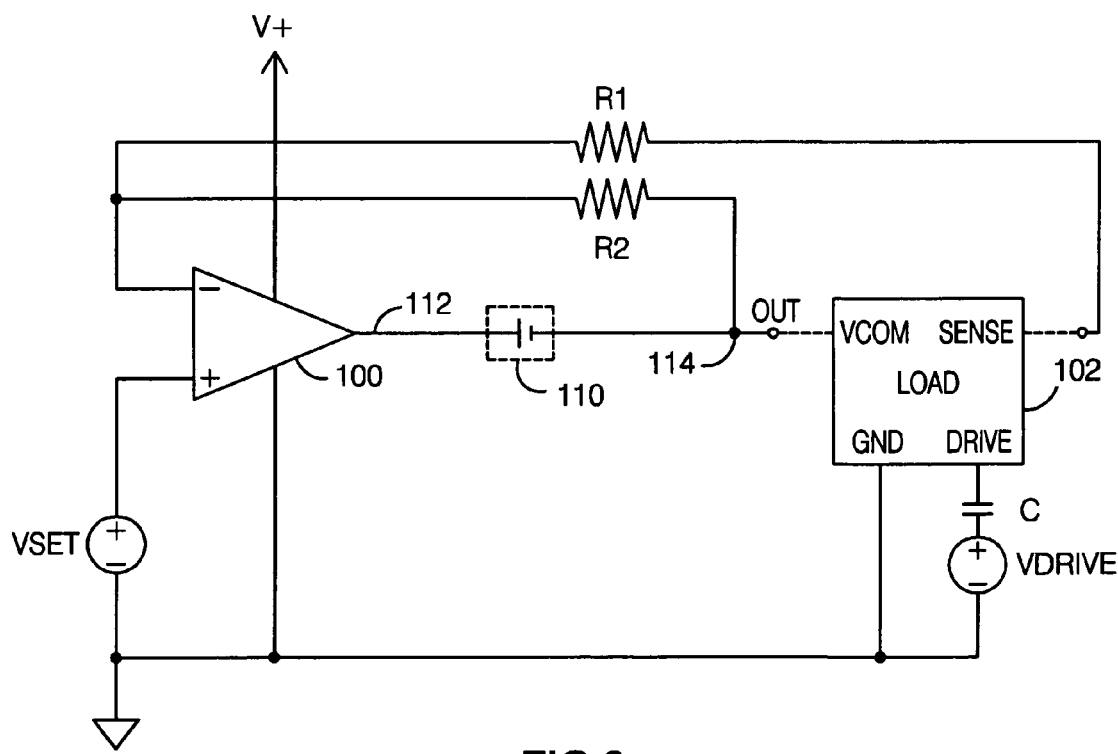
FIG. 3 is a block diagram illustrating the principles of a preferred embodiment of the present amplifier circuit.

However, for many applications, only a single supply voltage is available. For this case, the invention overcomes the limitation on maximum negative voltage excursion as illustrated in FIG. 3. Here, a fixed floating voltage source 110 is connected in series between the output 112 of amplifier, and the amplifier circuit's "final" output node 114. If the voltage of source 110 is properly selected, the voltage provided at node 114 and to load 102 can be set to a desired value while the voltage at amplifier output 112 is positioned, for example, in the center of its possible range. For example, assume that V+ is 12V, VSET is 4V, and source 110 is selected such that final output node 114 is 2V below amplifier output 112. When so arranged, when the amplifier is in an equilibrium state, the voltage at node 114 can be 4V when amp output 112 is at 6V. Now the maximum negative voltage excursion at nodes 112 and 114 is 6V, instead of the 4V available without voltage source 110—permitting the load to be driven negative with respect to ground without the need for a negative supply voltage.

Figure 4:
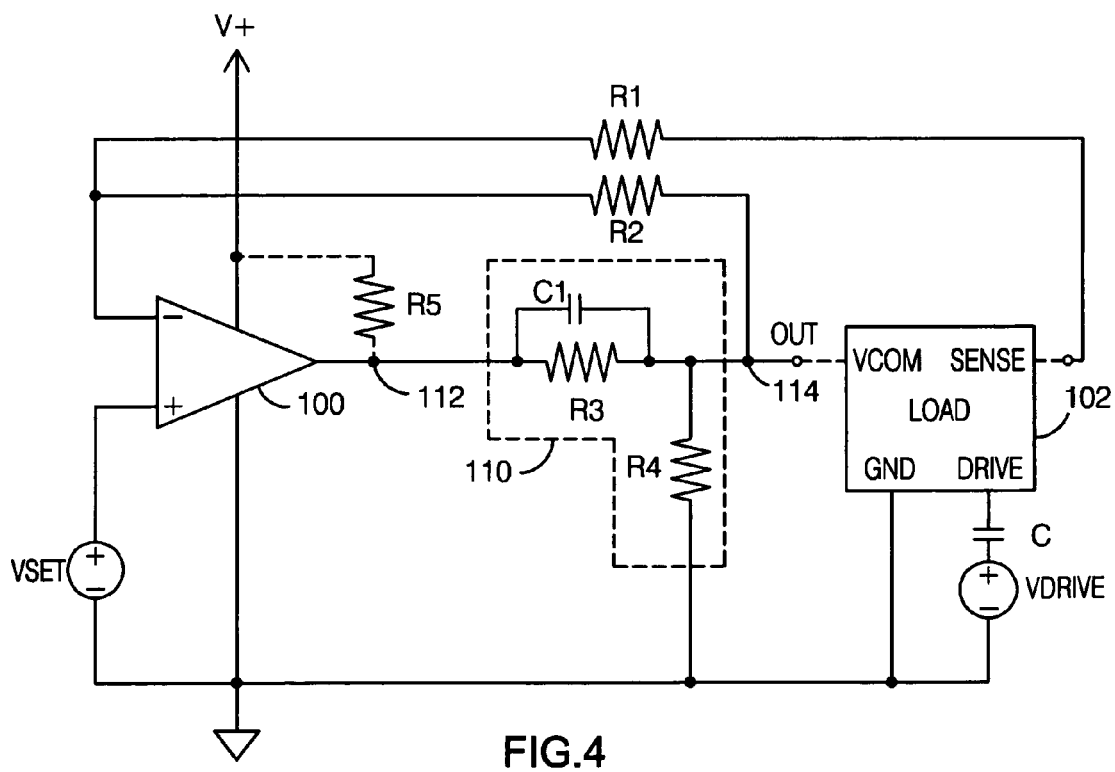
FIG. 4 is a block/schematic diagram of a preferred embodiment of the present amplifier circuit.

A preferred embodiment of an amplifier output voltage swing extender circuit in accordance with the present invention is shown in FIG. 4. Here, source 110 is implemented with a voltage divider comprising a resistance R3 connected in series between amplifier output 112 and final output node 114 and a resistance R4 connected between node 114 and circuit ground, and a capacitance C1 connected across R3.

When so arranged, the equilibrium output voltage of amplifier 100 is reduced by the voltage divider. The feedback voltage provided to the amplifier is taken from the lower voltage; for the application shown in FIG. 4, the feedback network comprises R2 and R1, connected between the amp's inverting input and final output node 114 and the LCD panel's SENSE output, respectively. As a result, the amplifier output voltage will rise, in order to balance the feedback voltage with the VSET voltage. That is, the junction of R3 and R4 (final output node 114) becomes the effective output for biasing and driving the load, while the amplifier's output voltage at node 112 rises to accommodate the voltage divider.

Capacitor C1 bypasses R3 for high frequency signals, enabling the full excursion of amplifier output 112 to be conveyed to final output node 114 without attenuation by the voltage divider. When used for the LCD panel application discussed above, the C1*R3 time constant is made large with respect to the row driving period, so that changes in the amplifier output voltage translate directly to the panel's VCOM input.

Assuming that R3 is 2 kΩ, R4 is 4 kΩ, and VSET is 4V, for example, at equilibrium the amplifier output voltage at node 112 is 6V and the voltage at final output node 114 is 4V. Thus, the maximum negative voltage excursion at node 112 will be 6V. This 6V pulse is coupled directly to the panel's VCOM input and is capable of driving this point nearly 2V below circuit ground. This represents a 50% increase over the signal available for the prior art arrangement shown in FIG. 1, enabling the present circuit to restore proportionally more charge to the LCD panel in a single row time.

This arrangement reduces the magnitude of the available positive pulses. However, for the LCD panel application, because the pixel polarities alternate, there is little or no advantage to having signals of one polarity exceed the other. In general, it will be advantageous to choose the values of R3 and R4 so as to locate the equilibrium voltage at amplifier output 112 midway between the output voltage swing limits. In the case of a rail-to-rail single-supply amplifier, this will be at half the supply voltage.

Figure 1:
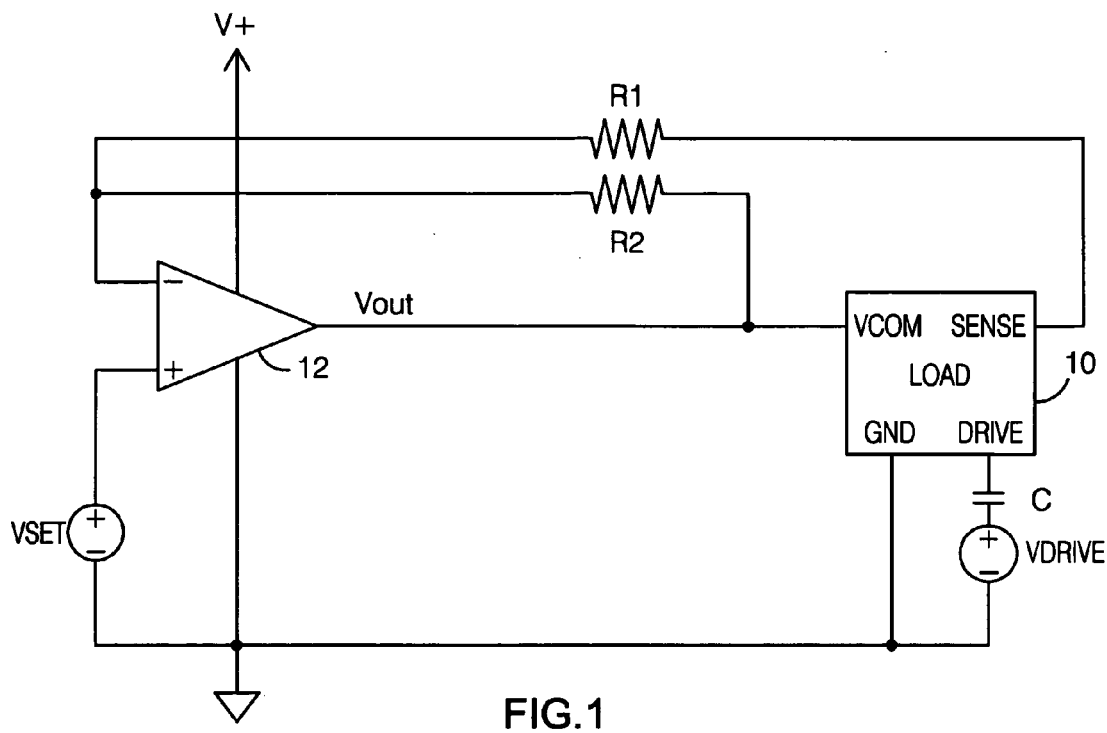
FIG. 1 is a block diagram of a known amplifier circuit.

In FIG. 1, the smaller of the two pulse polarities is limited by the nominal VCOM voltage at the amplifier output. There is little or no fundamental advantage in powering the amplifier from a voltage substantially more than twice this value, since only the positive pulses can be enhanced by this voltage. Using the circuit of FIG. 4, however, the amplitude of both polarities of pulse can be increased by using a higher supply voltage, if one is available.

FIG. 4 also shows an optional resistance R5, connected between V+ and node 112, which can be used to restore balance to the amplifier output stage current. If used, R5 should be selected to supply the current needed to bias R4, and so restore an approximately zero output current condition to the amplifier at equilibrium. This might be desirable to reduce the operating current of an IC amplifier, particularly if other considerations dictate a lower resistance level for the voltage divider.

Figure 5:
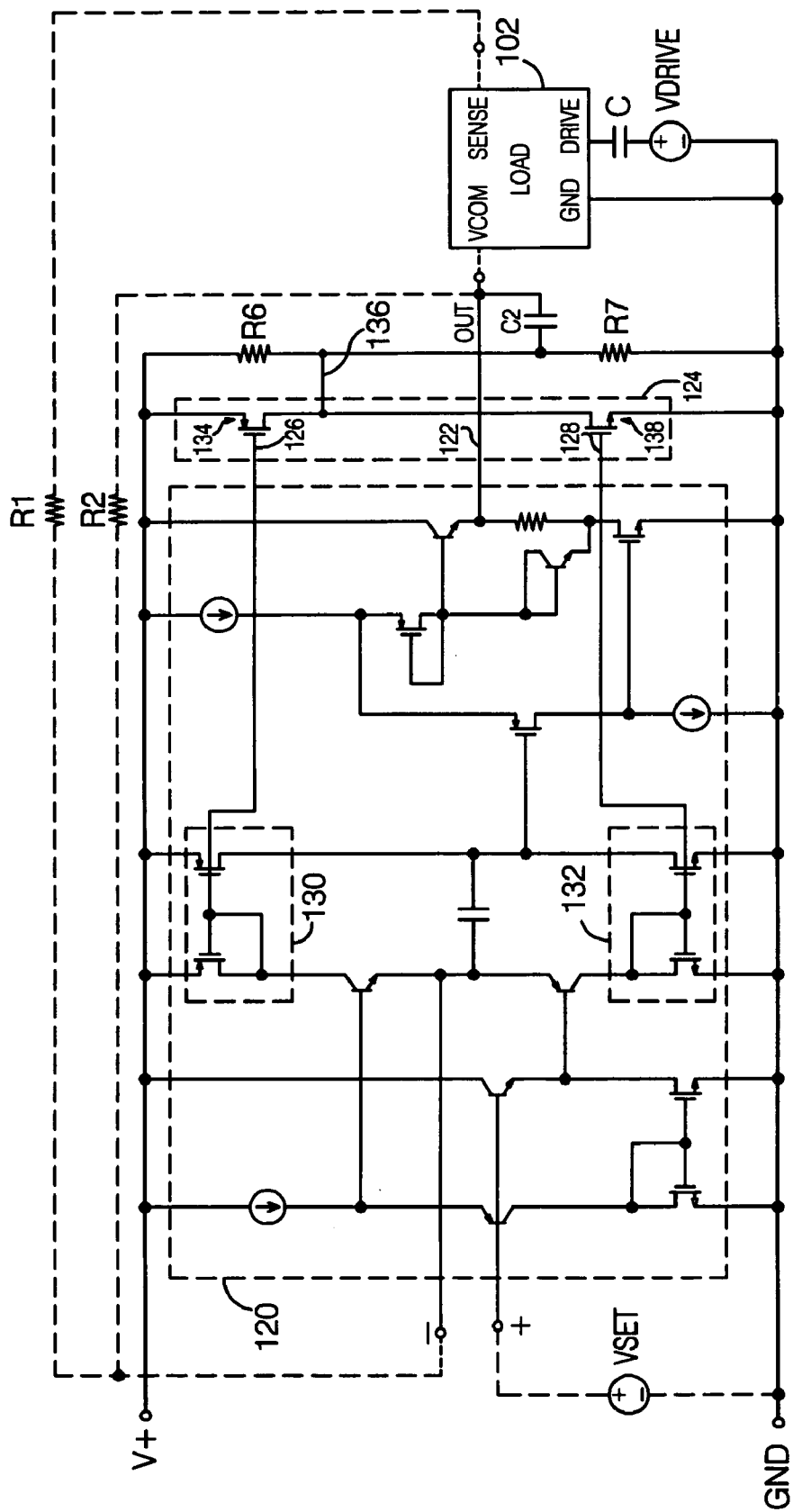
FIG. 5 is a schematic diagram of another possible embodiment of an amplifier circuit in accordance with the present invention.

An amplifier circuit specially adapted for response to an overdrive condition, as might be encountered in providing the VCOM voltage to an LCD panel, is described in co-pending U.S. patent application Ser. No. 11/313,545. One possible embodiment is shown in FIG. 5. In this circuit, a small signal amplifier 120 provides small signal response and settling to establish the VCOM level for the LCD panel; the small signal output is provided at an output node 122. The amplifier circuit also includes a high-powered output stage 124 which is activated by large signals at its inputs (126, 128). This auxiliary stage provides rapid response and high current capability when needed.

Amplifier 120 includes first and second current mirrors 130 and 132, which mirror respective currents that vary with the differential input voltage. Output stage 124 preferably comprises a first transistor 134 connected between V+ and a node 136 which is arranged to conduct a first boost current to node 136 when on, and a second transistor 138 connected between node 136 and circuit ground and arranged to conduct a second boost current to node 136 when on. Transistors 134 and 138 are preferably DMOS devices, while the FETs making up current mirrors 130 and 132 are regular MOS devices. The threshold voltages of the DMOS devices are larger than those of the regular MOS devices; as such, little or no current flows in FETs 134 and 138 under normal equilibrium conditions. However, if the inverting input of amp 120 is driven positive with respect to VSET, for example, the voltage across current mirror 132 will rise and turn on FET 138, driving node 136 close to ground. Similarly, if the inverting input is driven low with respect to VSET, the voltage across mirror 130 is increased, turning on FET 134 and driving node 136 close to V+. This enables output stage 124 to provide large load currents which might otherwise overload small signal amplifier 120.

Rather than being connected to drive output terminal 122 directly, output stage 124 is preferably separated from small signal output terminal 122 for purposes of DC biasing. Here, a resistance R6 is connected between V+ and node 136 and a resistance R7 is connected between node 136 and ground, and a capacitance C2 is connected between node 136 and output terminal 122 to couple the pulse or high frequency response of output stage 124 to output terminal 122, and thus to a load such as an LCD panel.

Under small signal conditions, FETs 134 and 138 will be off, and R6 and R7 determine the voltage at node 136. For a single supply application as shown in FIG. 5, R6 and R7 are typically equal, such that node 136 is set to half the supply voltage.

When the input of the amplifier is overdriven, one of FETs 134 and 138 will be activated to drive node 136. Signals at node 136 are coupled directly to output terminal 122 via C2. Since the DC bias at node 136 is half the supply voltage, symmetric pulses approaching plus or minus (V+)/2 can be generated at node 136 and coupled to the load. When so arranged, the amplitude of negative-going pulses can easily exceed VSET.

As the circuit of FIG. 5 enables the output voltage at node 122 to swing below GND, it would typically be necessary to isolate devices connected to the output voltage from the normally grounded substrate. In addition, it would typically be necessary to prevent the inherent connection of the output to GND from becoming forward-biased by a negative output voltage; this might be done with a series connected isolated diode.

While particular embodiments of the invention have been shown and described, numerous variations and alternate embodiments will occur to those skilled in the art. Accordingly, it is intended that the invention be limited only in terms of the appended claims.

I claim:

1. An amplifier circuit, comprising:
   first and second power supply rails, said first rail being positive with respect to said second rail;
   a differential amplifier powered between said rails which receives first and second input signals at respective input nodes and provides an output signal at a first output node;
   a level shifting circuit connected in series with said first output node which shifts the voltage of said first output node toward said second rail by a fixed amount, said shifted voltage provided at a second output node; and
   a feedback network which couples the voltage at said second output node to one of said differential amplifier's first and second input nodes as a feedback signal;
   such that, when a voltage VSET is applied to the other of said differential amplifier's input nodes, the maximum negative voltage excursion at said first and second output nodes is greater than the value of said VSET voltage with respect to said second supply rail.

2. The amplifier circuit of claim 1, wherein said level shifting circuit comprises:
   a first resistance connected in series between said first output node and said second output node;
   a second resistance connected in series between said second output node and said second rail such that said first and second resistances form a voltage divider; and
   a capacitance C1 connected across said first resistance.

3. The amplifier circuit of claim 2, wherein the voltage at said second output node is connected to drive a load to drive a load which requires said second output node voltage to periodically change polarity, said capacitance sized such that the product of said first resistance and C1 is greater than said period.

4. The amplifier circuit of claim 1, wherein VSET is a known voltage, said level shifting circuit arranged such that said first output node is equal to [(V+)-(V−)]/2 when VSET is at said known voltage and said amplifier circuit is in an equilibrium state, wherein V+ and V− are said first and second power supply rail voltages, respectively.

5. The amplifier circuit of claim 1, wherein said second power supply rail voltage is circuit ground.

6. The amplifier circuit of claim 1, further comprising a first resistance connected between said first power supply rail and said first output node.

7. The amplifier circuit of claim 6, wherein said level shifting circuit comprises:
a second resistance connected in series between said first output node and said second output node;
a third resistance connected in between said second output node and said second rail such that said second and third resistances form a voltage divider; and
a capacitance C1 connected across said second resistance;
said first resistance sized to provide the current needed to bias said third resistance such that said differential amplifier's output current is approximately zero when said amplifier circuit is in an equilibrium state.

8. An amplifier circuit, comprising:
a first power supply voltage V+;
a differential amplifier powered between V+ and circuit ground which receives first and second input signals at non-inverting and inverting inputs, respectively, and provides an output signal at a first output node;
a second output node;
a first resistance connected in series between said first output node and said second output node;
a second resistance connected in between said second output node and said second rail such that said first and second resistances form a voltage divider;
a capacitance C1 connected across said first resistance; and
a feedback network which couples the voltage at said second output node to said differential amplifier's inverting input as a feedback signal;
such that, when a voltage VSET is applied to said non-inverting input, the maximum negative voltage excursion at said first and second output nodes is greater than the value of said VSET voltage with respect to circuit ground.

9. The amplifier circuit of claim 8, wherein VSET is a known voltage, said voltage divider arranged such that said first output node is equal to (V+)/2 when VSET is at said known voltage and said amplifier circuit is in an equilibrium state.

10. The amplifier circuit of claim 8, wherein the voltage at said second output node is connected to drive a load which requires said second output node voltage to periodically change polarity, said capacitance sized such that the product of said first resistance and C1 is greater than said period.

11. The amplifier circuit of claim 8, further comprising a third resistance connected between said first power supply rail and said first output node sized to provide the current needed to bias said second resistance such that said differential amplifier's output current is approximately zero when said amplifier circuit is in an equilibrium state.

12. An amplifier circuit, comprising:
first and second power supply rails, said first rail being positive with respect to said second rail;
a small signal amplifier powered between said rails which receives first and second input signals applied to respective input nodes and provides an output signal at a first output node suitable for driving a load, said small signal amplifier arranged such that said output signal varies approximately linearly with the difference voltage between said input signals when said difference voltage is less than a predetermined threshold;
a capacitance connected to AC-couple a second node to said first output node;
a first resistance connected between said first rail and said second node;
a second resistance connected between said second node and said second rail, such that said first and second resistances establish the voltage at said second node when said difference voltage is less than said predetermined threshold; and
a large signal output boost stage, comprising:
a first transistor connected between said first rail and said second node and arranged to conduct a first boost current to said second node when on; and
a second transistor connected between said second node and said second rail and arranged to conduct a second boost current to said second node when on, said amplifier circuit arranged such that:
said first transistor turns on and drives said second node close to said first supply rail when said difference voltage is greater than said predetermined threshold and said second input signal is negative with respect to said first input signal, and
said second transistor turns on and drives said second node close to said second supply rail when said difference voltage is greater than said predetermined threshold and said second input signal is positive with respect to said first input signal;
such that, when said difference voltage is greater than said predetermined threshold, said large signal output boost stage drives said second node so as to provide load currents which might otherwise overload said small signal amplifier.

13. The amplifier circuit of claim 12, further comprising a feedback network which couples the voltage at said first output node to one of said op amp's first and second input nodes as a feedback signal;
said amplifier circuit arranged such that, when a voltage VSET is applied to the other of said op amp's input nodes, the maximum negative voltage excursion at said first output node and said second node is greater than the value of said VSET voltage with respect to said second supply rail.

14. A method of providing a signal which drives a largely capacitive load, comprising:
providing a differential amplifier powered between first and second power supply rails, said first rail being positive with respect to said second rail, which receives a setpoint voltage at one input and a feedback voltage at its other input and provides an output at a first output node so as to make said feedback voltage equal to said setpoint voltage;
level shifting said output towards said second rail by a fixed amount, said level-shifted voltage appearing at a second output node;
providing said level-shifted voltage as said feedback voltage; and
using said level-shifted voltage to drive said load such that the maximum negative voltage excursion at said first and second output nodes is greater than the value of said setpoint voltage with respect to said second supply rail.

15. The method of claim 14, wherein said level shifting comprises:
connecting a first resistance in series between said first output node and said second output node;
connecting a second resistance in series between said second output node and said second rail such that said first and second resistances form a voltage divider; and
connecting a capacitance C1 across said first resistance.

* * * * *